US006226538B1

United States Patent
Kugai et al.

(10) Patent No.: US 6,226,538 B1
(45) Date of Patent: May 1, 2001

(54) MAGNETIC SENSOR WITH SQUID AND HAVING SUPERCONDUCTING COILS FORMED ON SAPPHIRE SUBSTRATE

(75) Inventors: Hirokazu Kugai; Tatsuoki Nagaishi; Hideo Itozaki, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/189,801

(22) Filed: Nov. 12, 1998

(30) Foreign Application Priority Data

Dec. 25, 1997 (JP) .................................... 9-357425

(51) Int. Cl.$^7$ .......................... G01R 33/035; H01L 39/22
(52) U.S. Cl. .......................... 505/162; 324/248; 505/702; 505/846
(58) Field of Search .............................. 324/248; 257/33, 257/34; 505/162, 845, 846, 702, 705; 29/599; 427/62, 63

(56) References Cited

U.S. PATENT DOCUMENTS

| | | | |
|---|---|---|---|
| 4,801,882 | * | 1/1989 | Daalmans ............................ 324/248 |
| 4,804,915 | * | 2/1989 | Hoenig ................................ 324/248 |
| 5,012,190 | * | 4/1991 | Dossel ................................. 324/248 |
| 5,139,192 | * | 8/1992 | Simmonds . |
| 5,218,297 | * | 6/1993 | Nakane et al. ....................... 324/248 |
| 5,465,049 | * | 11/1995 | Matsuura et al. ..................... 324/248 |
| 5,567,673 | * | 10/1996 | Face et al. . |
| 5,625,290 | * | 4/1997 | You .................................... 324/248 |
| 5,767,043 | * | 6/1998 | Cantor et al. ..................... 324/248 X |

OTHER PUBLICATIONS

Properties of $YBa_2Cu_3O_{7-y}$ Large Washer SQUID; Jpn. J. Appl. Phys. vol. 32 (1993) pp. L662–L664.
High performance dc SQUID magnetometers with single layer $YBa_2Cu_3O_{7-x}$ flux transformers; Appl. Phys. Lett. vol. 63 (26), Dec. 27, 1993 pp. 3630–3632.

* cited by examiner

Primary Examiner—Gerard R. Strecker
(74) Attorney, Agent, or Firm—Smith, Gambrell & Russell

(57) ABSTRACT

This magnetic sensor comprises a flux transformer 2 having a superconducting thin film 2f formed on a sapphire substrate 2s, and a SQUID 1 disposed on the flux transformer 2 opposite thereto. In this magnetic sensor, since the sapphire substrate 2s, which can be obtained in a large size, is used for the flux transformer 2, even when the SQUID 1 is made smaller, the magnetic flux introduced from the flux transformer 2 into the SQUID 1 can be enhanced so as to increase the effective magnetic flux capturing area, whereby the detecting performance is improved, while the manufacturing cost can be reduced due to the smaller size of the SQUID 1.

3 Claims, 4 Drawing Sheets

MAGNETIC SENSOR WITH SQUID AND HAVING SUPERCONDUCTING COILS FORMED ON SAPPHIRE SUBSTRATE

BACKGROUND OF THE INVENTION

1. Field of the Invention

The present invention relates to a magnetic sensor utilizing a superconductor.

2. Related Background Art

A conventional sensor using a SQUID (superconducting quantum interference device) is disclosed, for example, in "Jpn. J. Appl. Phys. vol. 32, p. 662–664 (1993)." For improving the magnetic field resolution of a SQUID, it is necessary to increase the area by which the SQUID effectively captures a magnetic flux (effective flux capturing area). To this end, the size of the SQUID is enhanced so as to increase the effective magnetic flux capturing area in the above-mentioned publication.

SUMMARY OF THE INVENTION

Enhancing the size of SQUID, however, reduces the number of SQUIDs that can be produced from a single wafer substrate. Namely, while 9 pieces of 5-mm square SQUIDs can be made on a 20-mm square substrate, only one 17-mm square SQUID can be made thereon, thus increasing the manufacturing cost by a factor of 9. Therefore, in "Appl. Phys. Lett. vol. 63, p. 3630–3632(1993)," a single-layer flux transformer for introducing a magnetic flux to be detected is opposed to the SQUID, so as to enhance the effective magnetic flux capturing area. In this publication, a YBCO superconducting thin layer is formed on a YSZ substrate, so as to constitute a flux transformer. Since the YSZ substrate is expensive, however, it has not been possible to enhance the size of the magnetic transformer so as to increase the effective magnetic flux capturing area and realize a high-performance, low-cost magnetic sensor. In view of this problem, it is an object of the present invention to provide a high-performance, low-cost magnetic sensor.

In order to solve the above-mentioned problem, the magnetic sensor in accordance with the present invention comprises a flux transformer having a superconducting thin film formed on a sapphire substrate, and a SQUID disposed on the flux transformer opposite thereto. Since this magnetic sensor uses, for a flux transformer, a sapphire substrate which can be obtained in a large size at a low cost, even when the SQUID is made smaller, the magnetic flux introduced from the flux transformer into the SQUID can be enhanced so as to increase the effective magnetic flux capturing area, whereby the detecting performance is improved, while the manufacturing cost can be reduced due to the smaller size of the SQUID. Here, from the viewpoint of manufacturing cost, the superconducting thin film is preferably a single layer.

As a result of diligent studies concerning superconducting materials which can be formed on a sapphire substrate, the inventors have found that Ho oxide superconductors can be formed as a superconducting thin film on the sapphire substrate. In particular, when the superconducting thin film comprises an HoBaCuO thin film, and it is formed on the sapphire substrate with a cerium oxide layer interposed therebetween, its crystal state and characteristics would become favorable. When the flux transformer is formed on the sapphire substrate as mentioned above, the SQUID can be made smaller. Namely, the SQUID is preferably shaped like a washer having an annular part made of a superconducting material, and the annular part of the SQUID preferably has an outside diameter not greater than 5 mm. This annular part can detect, at its opening, the magnetic flux from the magnetic transformer. Here, the outside diameter of the SQUID is defined by the square root of the area of the part of SQUID constituting the superconducting closed loop of the SQUID, i.e., the area of the annular part.

Also, it is preferred that a predetermined portion of the annular part form a Josephson junction by covering a step edge which traverses thereunder. The Josephson junction in the present invention is formed by utilizing a weak junction formed at the step edge portion when a superconducting material covers the step edge. When such a step edge type Josephson junction is included in the annular part, a quantum mechanical interference effect occurs due to the macroscopic quantum effect of superconductivity, thus allowing the detecting magnetic field sensitivity to increase.

Preferably, in the magnetic sensor of the present invention, a predetermined portion of the annular part forms a Josephson junction, the annular part has a slit cut toward a position between a predetermined outer edge point and a predetermined inner edge point of the annular part from a point different from the predetermined outer edge point in the outer edge, the Josephson junction traverses between the predetermined inner edge point side of a ridge defining the slit and the inner edge of the annular part, the superconducting thin film of the flux transformer has a pickup coil for acquiring a magnetic flux of a subject and an input coil connected to the pickup coil, and the input coil is disposed opposite to the annular part of the SQUID and covers the whole region of the slit.

The weak junction due to the Josephson junction is yielded by forming a grain boundary within the superconducting thin film with the aid of a step edge. For more favorably forming the weak junction, it is preferred that a slit be formed as mentioned above, such that the width of the Josephson junction is narrowed. Since the input coil of the magnetic transformer is connected to the pickup coil, the magnetic flux detected by the pickup coil is condensed within the input coil, so as to be introduced into the annual part of the SQUID opposed to the input coil. Since the slit is open at its proximal end side, the magnetic field to be introduced into the opening of the annual part of the SQUID from the input coil partially leaks out of the slit. Therefore, the present invention employs a structure in which, as mentioned above, the input coil is opposed to the annular part of the SQUID and covers the whole region of the slit, thereby suppressing the leaking phenomenon and improving the detecting sensitivity.

Further, when the inside diameter of the input coil is greater than the outside diameter of the annular part, the magnetic flux may partially leak out as in the case of the above-mentioned slit. Therefore, the present invention employs a structure in which the superconducting thin film of the flux transformer has a pickup coil for acquiring a magnetic flux of a subject and an input coil connected to the pickup coil, and the input coil is opposed to the annular part and has an inside diameter smaller than the outside diameter of the annular part, thereby suppressing the leakage and introducing a larger amount of magnetic field into the SQUID. Here, the inside diameter of the input coil is defined by the square root of the area of its opening portion.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENT

In the following, magnetic sensors in accordance with embodiments will be explained. Constituents identical to each other or having functions identical to each other will be referred to with numerals or letters identical to each other, without repeating their overlapping explanations.

(First Embodiment)

Figure 1:
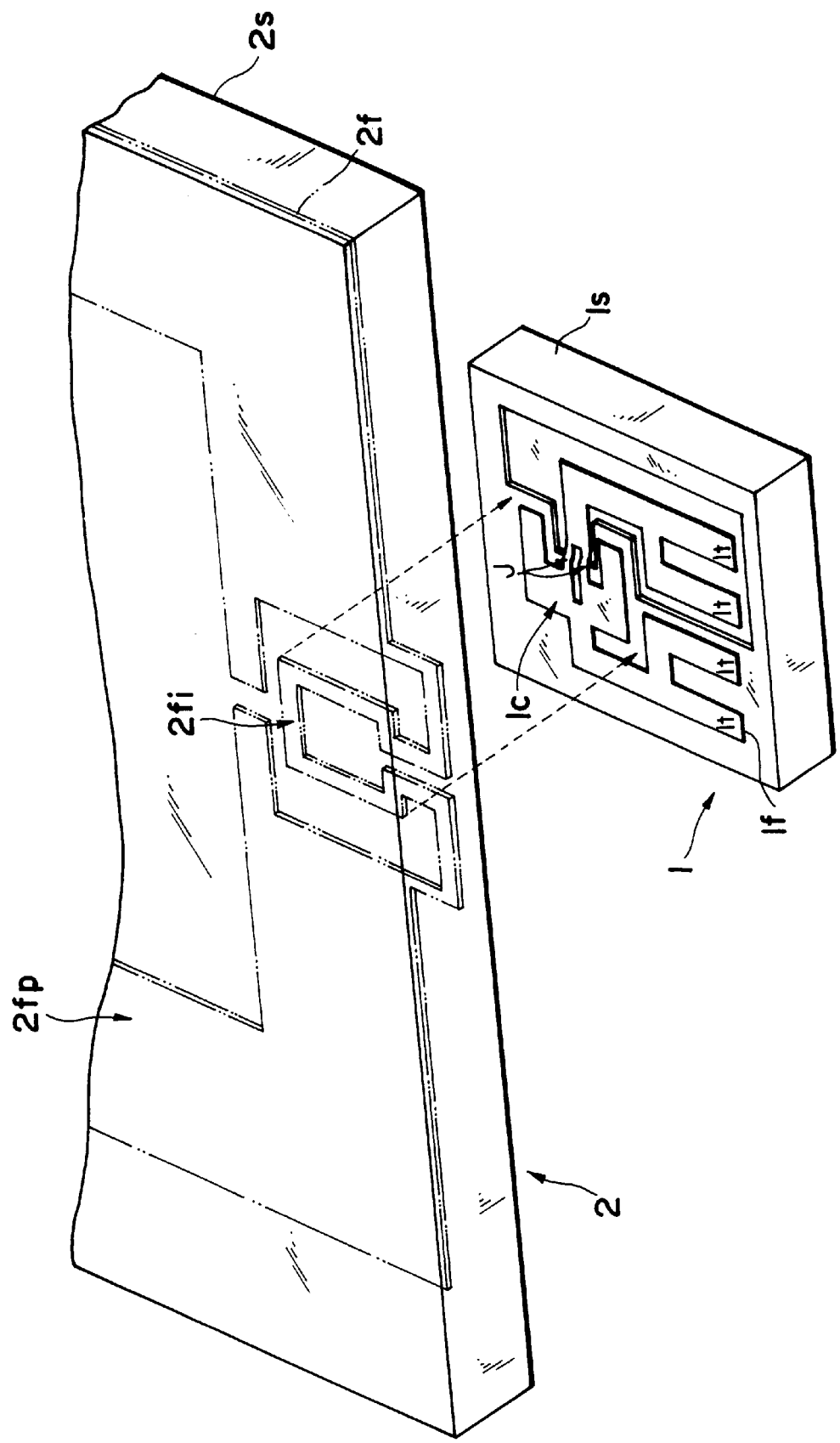
FIG. 1 is a perspective view showing a part of a magnetic sensor in accordance with an embodiment as being exploded.

FIG. 1 is a perspective view showing a magnetic sensor in accordance with an embodiment. This magnetic sensor comprises a flux transformer 2 having a superconducting thin film 2f formed on a sapphire substrate 2s, and a SQUID 1 disposed on the flux transformer 2 opposite thereto. The superconducting thin film 2f of the flux transformer 2 has a pickup coil 2fp for acquiring a magnetic flux of a subject, and an input coil 2fi electromagnetically connected to the pickup coil 2fp. The input coil 2fi is opposed to an annular part 1c of the SQUID 1. Here, the annular part 1c constitutes a washer part shaped like a washer.

Since the input coil 2fi of the magnetic transformer 2 is connected to the pickup coil 2fp, the magnetic flux detected by the pickup coil 2fp is condensed within the input coil 2fi, and is introduced into the opening of the annular SQUID part 1c opposed to the input coil 2fi. The annular part 1c can detect, at its opening, the magnetic flux from the magnetic transformer 2.

The SQUID 1 is constituted by a substrate is comprising $SrTiO_3$, and an $Ho_1Ba_2Cu_3O_{7-x}$ superconducting thin film 1f (where x is any real number). The annular SQUID part 1c is a portion of the HoBaCuO superconducting thin film 1f and, consequently, comprises a superconducting material. Also, the opening center of the annular part 1c substantially coincides with the center of the input coil 2fi. The annular part 1c constitutes a superconducting closed loop, and a predetermined portion J of the annular part 1c forms a Josephson junction by covering a step edge of the substrate 1s which traverses thereunder. In other words, this Josephson junction is formed by utilizing a weak junction which is formed at the step edge portion when the superconducting material covers the step edge. This step edge type Josephson junction is made by the steps of forming a step edge of 150 nm on the surface of a 20-mm square substrate 1s, and then depositing a superconducting thin film 1f having a thickness of 200 nm so as to cover the step edge. Here, laser deposition method is used for this formation.

When the above-mentioned step edge type Josephson junction is included in the superconducting closed loop constituted by the annular part 1c, a quantum mechanical interference effect occurs due to the macroscopic quantum effect of superconductivity, whereby the magnetic flux introduced from the input coil 2fi can be detected efficiently. In this example, since two sites of Josephson devices J are included in the superconducting closed loop, when an external magnetic flux is introduced into the opening of the annular part 1c from the input coil 2fi, voltage values taken out from terminals 1t connected to both ends of the loop would vary, whereby the external magnetic flux can be detected with a high accuracy. Namely, in the magnetic sensor in accordance with this embodiment, the magnetic flux detected by the large-size pickup coil 2fp of the flux transformer 2 is condensed within the small-size input coil 2fi and is introduced as an external magnetic flux into the annular part 1c of the SQUID 1, and the output voltage is observed, so as to detect the magnetism. Here, even one piece of Josephson device J can detect the magnetism as well.

Figure 2:
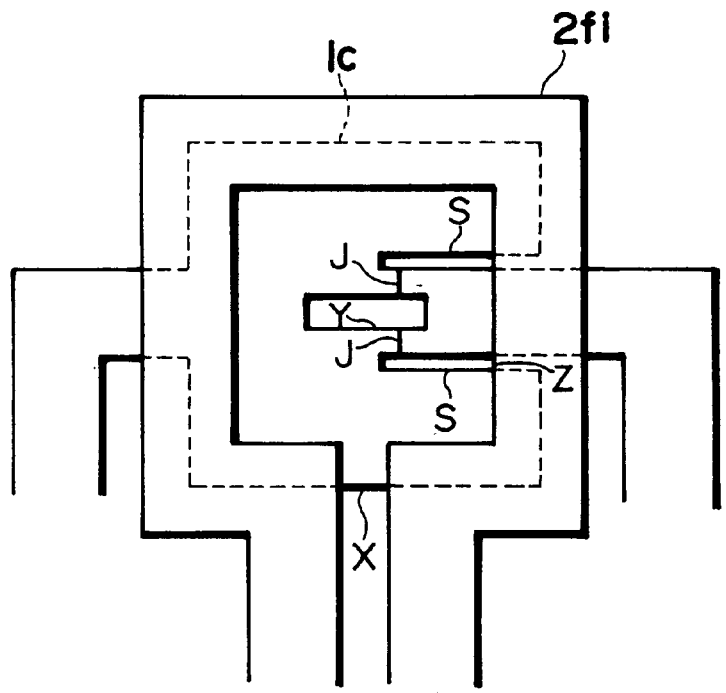
FIG. 2 is an enlarged view of an annular SQUID part 1c and portion of an input coil 2fi opposed to each other.

FIG. 2 is an enlarged view of the annular SQUID part 1c and portion of the input coil 2fi opposed to each other. As mentioned above, a predetermined portion of the annular part 1c forms the Josephson junction J. The annular part 1c has a slit S cut toward a position between a predetermined outer edge point X of the annular part and a predetermined inner edge point Y from a point Z different from the predetermined outer edge point X in the outer edge. Here, two slits S are cut such that their respective front ends are disposed at positions opposed to each other across the opening in the widthwise direction thereof, and the Josephson junctions J are disposed so as to match the respective slits S.

Each Josephson junction traverses between the predetermined inner edge point Y side of a ridge defining its corresponding slit S and the inner edge of the annular part 1c. The weak junction due to the Josephson junction J is yielded by forming a grain boundary within the superconducting thin film with the aid of a step edge. Since the slit S is formed as mentioned above so as to narrow the loop passage width of the annular part 1c, its junction is formed further favorably. Here, the width of Josephson junction is 3 $\mu$m, the width of the slit S is 10 $\mu$m, the width of the rectangular opening of the annular part 1c is 6 $\mu$m, its length is 100 $\mu$m, and the outside diameter size of the annular part 1c is 2-mm square. On the other hand, the pickup coil 2fp has an outside diameter size of 17-mm square, an inside diameter size of 11-mm square, and a coil width of 3 mm. Further, the input coil 2fi has an outside diameter size of 3.5-mm square, an inside diameter size of 1.5-mm square, and a coil width of 1 mm. Here, the outside diameter of the annular part 1c of the SQUID 1 is defined by the square root of the area of the part of SQUID 1 constituting the superconducting closed loop, i.e., the area of the annular part 1c, whereas the inside diameter of the input coil 2fi is defined by the square root of the opening area thereof.

When the inside diameter of the input coil 2fi is greater than the outside diameter of the annular part 1c, the magnetic flux partially leaks out. Therefore, in this example, the input coil 2*fi* is opposed to the annular part 1*c* of the SQUID 1, while the inside diameter of the input coil 2*fi* is made smaller than the outside diameter of the annular part 1*c*, thereby yielding a structure which suppresses the leakage so as to introduce a larger amount of magnetic flux into the opening of the SQUID 1. Here, the input coil 2*fi* may also be modified as shown in the next drawing.

Figure 3:
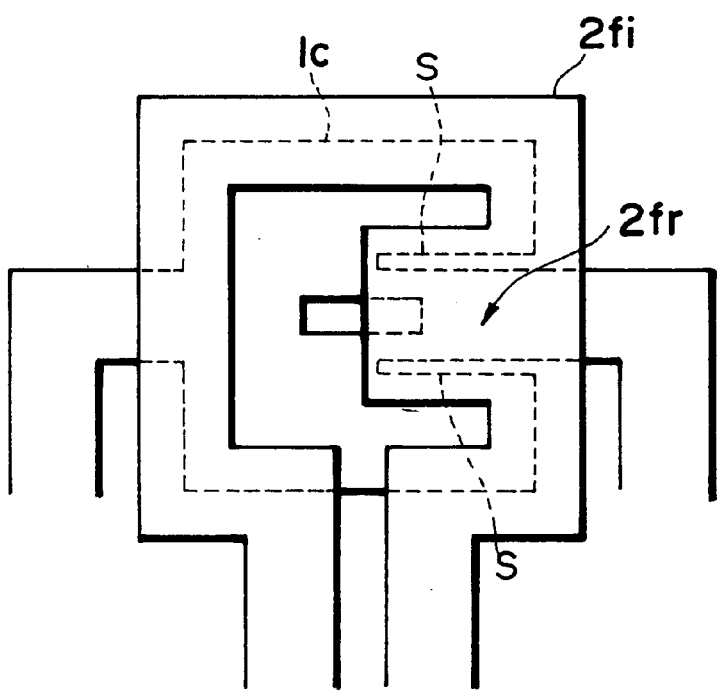
FIG. 3 is an enlarged view of an annular SQUID part 1c and portion of a modified input coil 2fi opposed to each other.

FIG. 3 is an enlarged view of the annular SQUID part 1*c* and portion of a modified input coil 2*fi* opposed to each other. Since the input coil 2*fi* of the magnetic transformer 2 is connected to the pickup coil 2*fp*, the magnetic flux detected by the pickup coil 2*fp* is condensed within the input coil 2*fi* and is introduced into the annular SQUID part 1*c* opposed to the input coil 2*fi*. In the configuration of FIG. 2, since the slit is open on its proximal end side, the magnetic field to be introduced into the opening of the annular SQUID part 1*c* from the input coil 2*fi* partially leaks out of the slit. Therefore, in this example, the input coil 2*fi* is opposed to the annular part 1*c* of the SQUID 1 and covers the whole region of the slit S, thereby yielding a structure which suppresses the above-mentioned leaking phenomenon and improves the detecting sensitivity. Namely, the input coil 2*fi* has a rectangular projecting area 2*fr* which projects from the outer annular portion toward the inside, and the projecting region 2*fr* has a width of 0.5 mm and a length of 1 mm.

Figure 4:
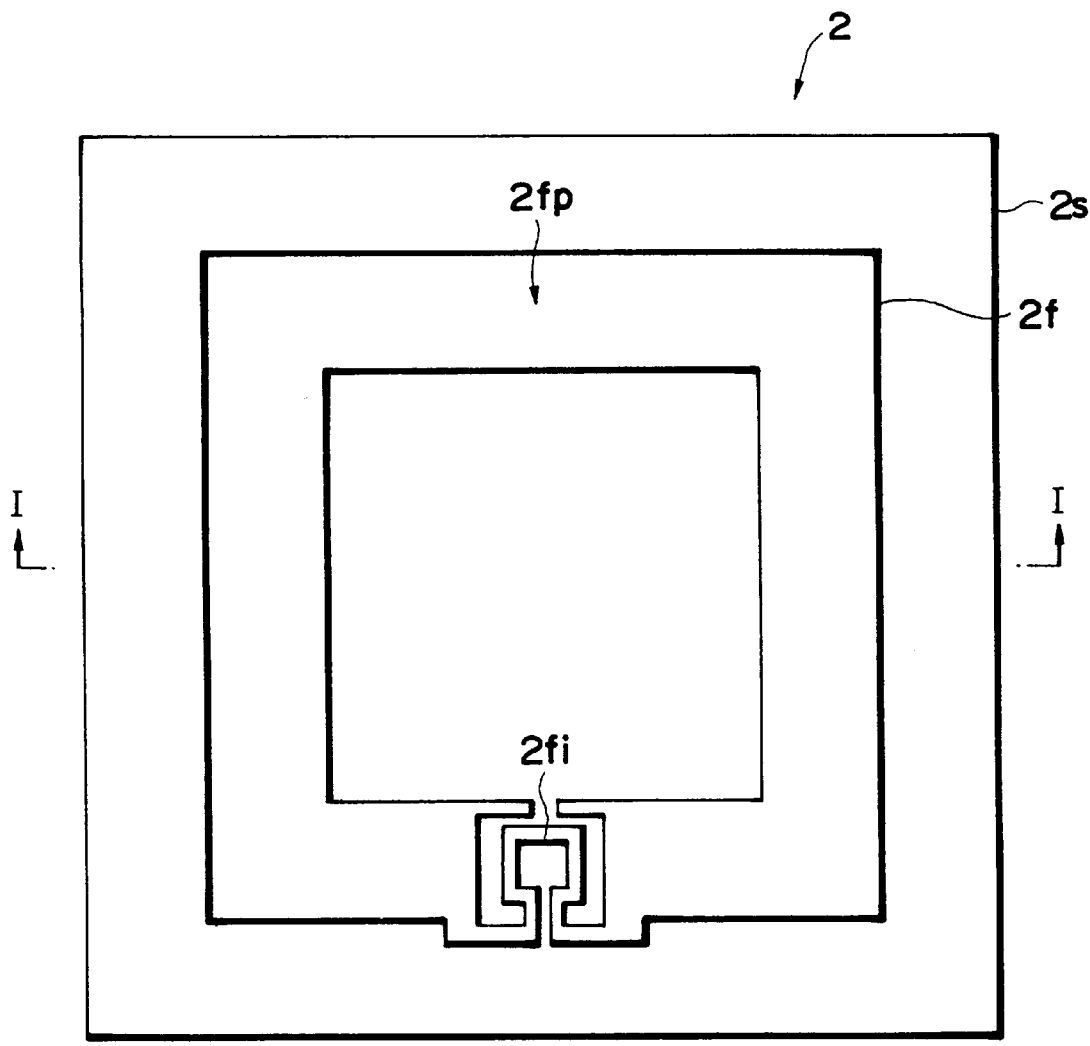
FIG. 4 is a plan view of a flux transformer 2 as viewed from its superconducting thin film 2f side.

FIG. 4 is a plan view of the flux transformer 2 as viewed from the superconducting thin film 2*f* side. When the flux transformer 2 is explained in detail, the superconducting thin film 2*f* formed on the sapphire substrate 2*s* comprises a rectangular annular thin film pickup coil 2*fp* and a rectangular annular thin film input coil 2*fi* electromagnetically connected thereto. As mentioned above, the opening area of the pickup coil 2*fp* is greater than that of the input coil 2*fi* and has a larger width.

Figure 5:
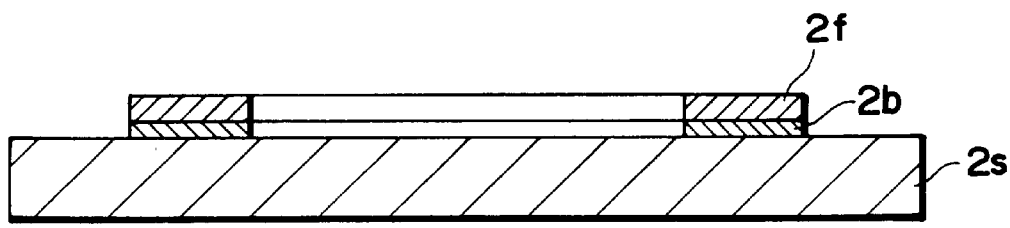
FIG. 5 is a sectional view of the flux transformer 2 shown in FIG. 4, taken along the arrowed line I—I.

FIG. 5 is a sectional view of the flux transformer 2 shown in FIG. 4, taken along the arrowed line I—I. As a result of diligent studies concerning superconducting materials which can be formed on the sapphire substrate 2*s*, it has been found that Ho oxide superconductors can be favorably formed as the superconducting thin film 2*f*. Since the sapphire substrate 2*s* is available in a large size at a low cost, the flux transformer 2 can be made with a larger size. Consequently, even when the SQUID 1 is made smaller, the magnetic flux introduced from the flux transformer 2 into the SQUID 1 can be enhanced so as to increase the effective magnetic flux capturing area, whereby the detecting performance is improved, while the manufacturing cost can be reduced due to the smaller size of the SQUID 1.

Namely, it is preferred that the outside diameter of the annular SQUID part 1*c* of the magnetic sensor in accordance with this embodiment be not greater than 5 mm. In particular, when the superconducting thin film 2*f* of the magnetic transformer 2 is constituted by $Ho_1Ba_2Cu_3O_{7-x}$, and is formed on the sapphire substrate 2*s* with a cerium oxide layer ($CeO_2$) 2*b* as a buffer layer interposed therebetween, its crystal state and characteristics would become favorable. Here, from the viewpoint of manufacturing cost, the HoBaCuO superconducting thin film 2*f* is preferably a single layer.

Also, unlike the SQUID 1, the flux transformer 2 does not include any Josephson junction, whereby the yield of the flux transformer 2 is higher than that of the SQUID 1. On the other hand, the number of devices produced in a single substrate is greater as the SQUID is smaller. Consequently, in the magnetic sensor in accordance with this embodiment, as the sapphire substrate 2*s* is employed, the magnetic transformer 2 having a large size can be produced with a high yield, whereby the SQUID 1 can be made smaller, and the productivity of magnetic sensor can be improved without deteriorating the detecting accuracy.

The method of making the magnetic transformer 2 and its characteristics will now be explained. The SQUID 1 and the flux transformer 2 were made successively, and they were combined together to produce a magnetic sensor, whose characteristics were then evaluated.

Figure 6:
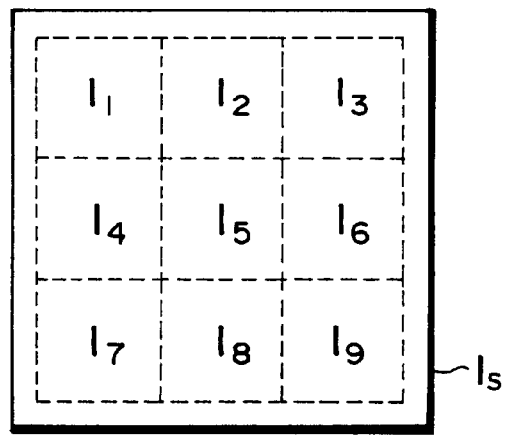
FIG. 6 is a plan view of an $SrTiO_3$ substrate 1s formed with SQUIDs $1_1$ to $1_9$.

FIG. 6 is a plan view of an $SrTiO_3$ substrate 1*s* formed with SQUIDs 1 (SQUIDs $1_1$ to $1_9$). For making the SQUIDs 1, first, prepared were 9 pieces in total of enclosable 20-mm square $SrTiO_3$ substrates 1*s*, each corresponding to the substrate 1*s* shown in FIG. 1, arranged in a matrix of 3 by 3 as shown in FIG. 6. After a 150-nm step edge for Josephson junction was formed in each of substrates 1*s*, an $Ho_1Ba_2Cu_3O_{7-x}$ thin film 1*f* having a thickness of 200 nm was formed thereon. The thin film 1*f* was formed by means of laser deposition method. Thereafter, thus formed thin film 1*f* was patterned by using photolithography technique. Finally, the individual SQUIDs $1_1$ to $1_9$ were diced along dotted lines in the drawing so as to be separated into 9 pieces of SQUIDs $1_1$ to $1_9$.

Figure 7:
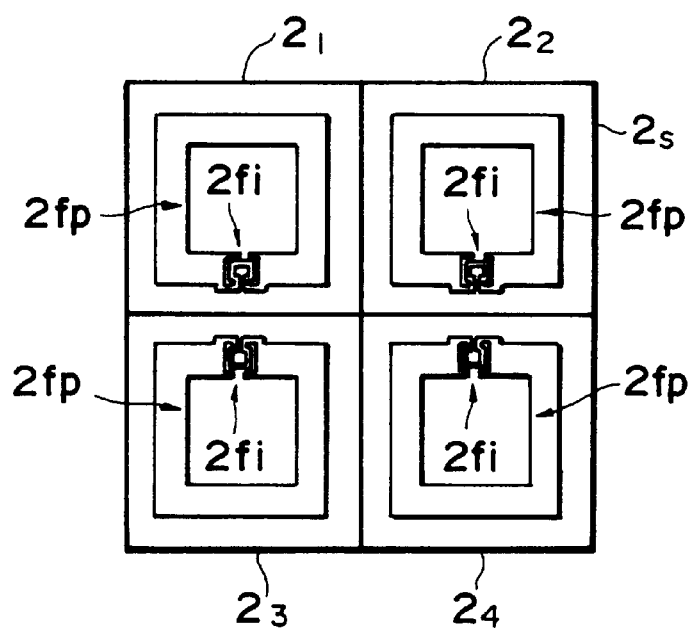
FIG. 7 is a plan view of a sapphire substrate 2s formed with flux transformers $2_1$ to $2_4$.

FIG. 7 is a plan view of the sapphire substrate 2*s* formed with flux transformers 2 (flux transformers $2_1$ to $2_4$) each including coils 2*fp* and 2*fs*. When making the flux transformers 2, first, prepared were 4 pieces in total of enclosable 40-mm square sapphire substrates 2s, each corresponding to the substrate 2s shown in FIG. 1, arranged in a matrix of 2 by 2 as shown in FIG. 7. On each of thus prepared sapphire substrates 2*s*, a $CeO_2$ buffer layer 2*b* having a thickness of 10 nm and an $Ho_1Ba_2Cu_3O_{7-x}$ thin film 2*f* having a thickness of 200 nm were successively formed thereon. The thin film 2*f* was formed by means of laser deposition method. Thereafter, thus formed thin film was patterned by using photolithography technique. Since the width of each input coil 2*fi* was narrower than the width of the pickup coil 2*fp*, the patterning was made such that all the input coils 2*fi* were positioned near the center parts of their corresponding substrates 2*s* where the quality of the thin layers was less likely to deteriorate. Finally, the individual flux transformers $2_1$ to $2_4$ were diced along dotted lines in the drawing so as to be separated into 4 pieces of flux transformers $2_1$ to $2_4$.

Thus formed SQUID 1 and flux transformer 2 were bonded together with a spacer interposed therebetween such that the input coil 2*fi* was overlaid on the annular part 1*c* of the SQUID 1, so as to produce a magnetic sensor. With this magnetic sensor immersed in liquid nitrogen, magnetism was measured. The effective magnetic flux capturing area of this magnetic sensor was 0.16 $mm^2$, whereas its magnetic field resolution was 120 $fT/\sqrt{Hz}$ at 10 Hz.

(Second Embodiment)

Next, a flux transformer 2 having the modified input coil 2*fi* shown in FIG. 3 was manufactured as with the first embodiment and was combined with the SQUID 1, so as to produce a magnetic sensor. With this magnetic sensor immersed in liquid nitrogen, magnetism was measured. The effective magnetic flux capturing area of this magnetic sensor was 0.24 $mm^2$, whereas its magnetic field resolution was 80 $fT/\sqrt{Hz}$ at 10 Hz.

(Third Embodiment)

Further, a flux transformer 2 similar to that shown in FIG. 3 except that the outside diameter size of the pickup coil 2*fp* was changed from 17-mm square to 37-mm square was manufactured as with the first embodiment and was combined with the SQUID 1, so as to produce a magnetic sensor. With this magnetic sensor immersed in liquid nitrogen, magnetism was measured. The effective magnetic flux capturing area of this magnetic sensor was 0.5 mm$^2$, whereas its magnetic field resolution was 40 fT/$\sqrt{\text{Hz}}$ at 10 Hz.

(Fourth Embodiment)

Also, a plurality of turns of the input coil 2fi may be wound so as to further enhance the detecting performance. Namely, in this example, a magnetic transformer 2 having a plurality of turns of the input coil 2fi was manufactured on the sapphire substrate 2s. The size of the pickup coil 2fp was the same as that in the first embodiment, the number of turns of the input coil 2fi was 20, the line width was 10 μm, and the space between lines was 5 μm. In this case, in the wiring part for drawing an output from the winding center of the coil to the outside, the input coil 2fi has a three-layer structure of superconducting thin film for coil/insulating film/wiring superconducting thin film. $Ho_1Ba_2Cu_3O_{7-x}$ was used as these superconducting thin films, whereas $CeO_2$ was used as the insulating film.

The superconducting thin film for coil as the first layer was manufactured similarly to the first embodiment, with a thickness of 200 nm. The insulating thin film and the wiring second superconducting thin film were formed by laser deposition method, with their respective thickness values of 150 nm and 200 nm. Each of thus formed layers were patterned in a manner similar to the first embodiment, so as to produce the input coil 2fi with the above-mentioned three-layer structure.

Thus manufactured flux transformer 2 having a plurality of turns of the input coil 2fi was combined with the SQUID 1 made similarly to the first embodiment, so as to produce a magnetic sensor. With this magnetic sensor immersed in liquid nitrogen, magnetism was measured. The effective magnetic flux capturing area of this magnetic sensor was 1.6 mm$^2$, whereas its magnetic field resolution was 12 fT/$\sqrt{\text{Hz}}$ at 10 Hz.

As explained in the foregoing, the magnetic sensor in accordance with the above-mentioned embodiments comprises the flux transformer 2 having the superconducting thin film 2f formed on the sapphire substrate 2s, and the SQUID 1 disposed on the flux transformer 2 opposite thereto. In this magnetic sensor, since the sapphire substrate 2s, which can be obtained in a large size, is used for the flux transformer 2, even when the SQUID 1 is made smaller, the magnetic flux introduced from the flux transformer 2 into the SQUID 1 can be enhanced so as to increase the effective magnetic flux capturing area, whereby the detecting performance is improved, while the manufacturing cost can be reduced due to the smaller size of the SQUID 1. Here, as the superconducting thin films 1f and 2f of the SQUID 1 and flux transformer 2, other oxide high-temperature superconducting materials such as YBaCuO(YBCO), BiSrCaCuO (BSCCO), TlBaCaCuO(TBCCO) may be used. Note that Y in YBCO can be changed to rare earth metal. As explained in the foregoing, since a sapphire substrate is used for a flux transformer, the magnetic sensor can improve the detecting performance, while being capable of reducing the manufacturing cost due to the smaller size of its SQUID.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A magnetic sensor comprising:

a flux transformer having two coils electromagnetically connected to each other, said coils being formed on a first substrate; and a SQUID having an annular part opposite to said flux transformer, said annular part facing one of said coils of said flux transformer, said annular part being formed on a second substrate, a predetermined portion of said annular part forming a Josephson junction by covering a step edge which traverses thereunder, wherein
   one of said coils is larger than the other one of said coils;
   the larger one of said coils is larger than said annular part;
   the smaller one of said coils faces said annular part;
   an outside diameter of said annular part is not greater than 5 mm;
   both of said coils and said annular part are made of a superconducting material comprised of Ho, Ba, Cu and O;
   said first substrate is comprised of a sapphire substrate and a cerium oxide layer is interposed between said sapphire substrate and said coils; and
   said second substrate is comprised of Sr, Ti and O.

2. A magnetic sensor according to claim 1, wherein said annular part has a slit cut toward a position between a predetermined outer edge point and a predetermined inner edge point of said annular part from a point different from said predetermined outer edge point in said outer edge;

said Josephson junction traverses between said predetermined inner edge point side of a ridge defining said slit and an inner edge of said annular part; and said larger one of said coils acquires a magnetic flux of a subject to be detected.

3. A magnetic sensor according to claim 2, wherein said smaller of said coils faces said annular part of said SQUID and covers an entire region of said slit.

\* \* \* \* \*